United States Patent
Hoetzl et al.

(10) Patent No.: US 8,587,021 B2
(45) Date of Patent: Nov. 19, 2013

(54) MOUNTING STRUCTURE FOR SOLID STATE LIGHT SOURCES

(75) Inventors: Guenter Hoetzl, Regensburg (DE); Huey Ling Lim, Regensburg (DE); Thomas Preuschl, Sinzing (DE); Peter Sachsenweger, Zeitlam (DE); Lorenzo Roberto Trevisanello, Abano Terme (IT); Steven Wetzel, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/430,463

(22) Filed: Mar. 26, 2012

(65) Prior Publication Data

US 2012/0241807 A1    Sep. 27, 2012

(30) Foreign Application Priority Data

Mar. 24, 2011  (IT) .............................. TO2011A0253

(51) Int. Cl.
*H01L 33/00* (2010.01)

(52) U.S. Cl.
USPC .......................................................... 257/99

(58) Field of Classification Search
USPC ........................ 257/81, 82, 91, 100, 116, 117, 257/432–437, 749, E33.056–E33.059, 257/E23.032, 459; 438/25–28
See application file for complete search history.

(56) References Cited

U.S. PATENT DOCUMENTS

| 5,488,256 | A | 1/1996 | Tsunoda |
| 6,318,622 | B1 | 11/2001 | Hollingsworth et al. |
| 2004/0218372 | A1* | 11/2004 | Hamasaki et al. ............ 361/767 |
| 2009/0073713 | A1 | 3/2009 | Glovatsky et al. |
| 2010/0270580 | A1* | 10/2010 | Posselt .......................... 257/100 |
| 2012/0161190 | A1* | 6/2012 | Yao ................................ 257/99 |
| 2012/0175643 | A1* | 7/2012 | West .............................. 257/88 |

FOREIGN PATENT DOCUMENTS

DE   10 2005 059 198   6/2007

* cited by examiner

*Primary Examiner* — Dao H Nguyen
*Assistant Examiner* — Tram H Nguyen
(74) *Attorney, Agent, or Firm* — Cozen O'Connor

(57) ABSTRACT

A mounting structure for solid-state light sources, for example of the LED type, comprises a support board; a submount mounted on said support board and having at least one solid-state light radiation source mounted thereon; a drive board carrying drive circuitry for the light radiation source, the aforementioned drive board being mounted on the support board and extending peripherally with respect to the aforementioned submount; electrical interface connections between the submount and the drive board for connecting the light radiation source to the drive circuitry; and mechanical and thermal interface connections between the submount and the support board.

14 Claims, 2 Drawing Sheets

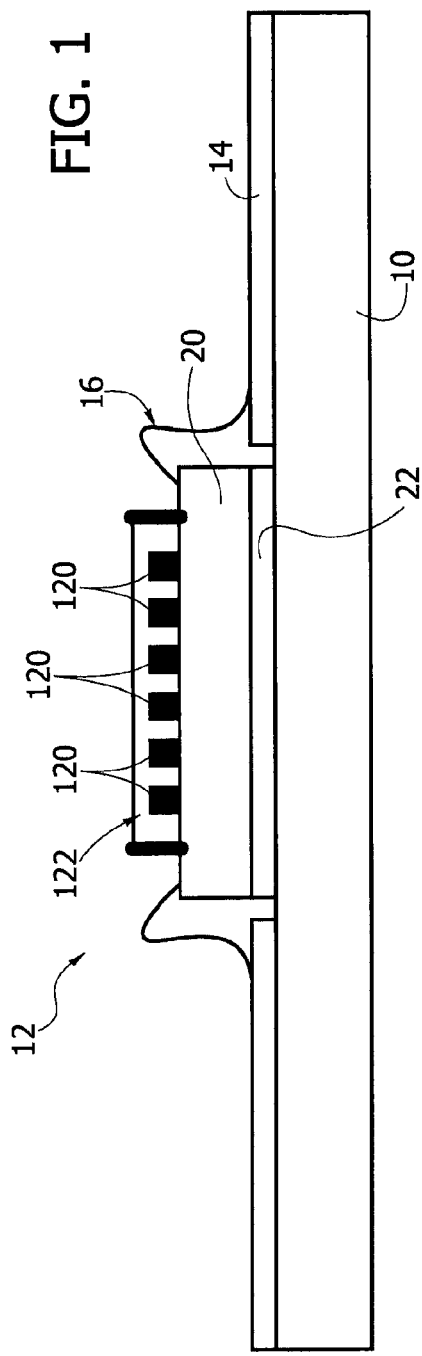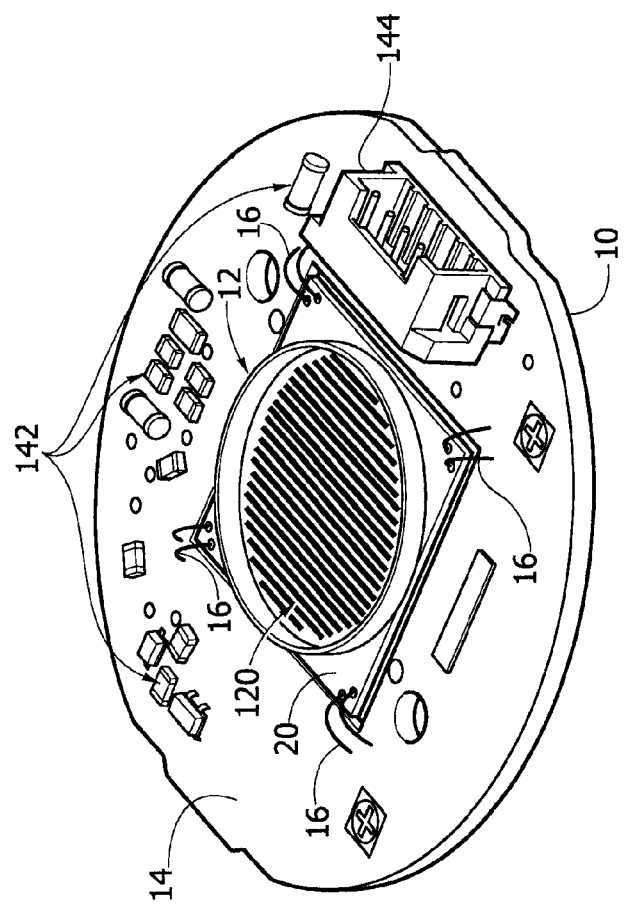

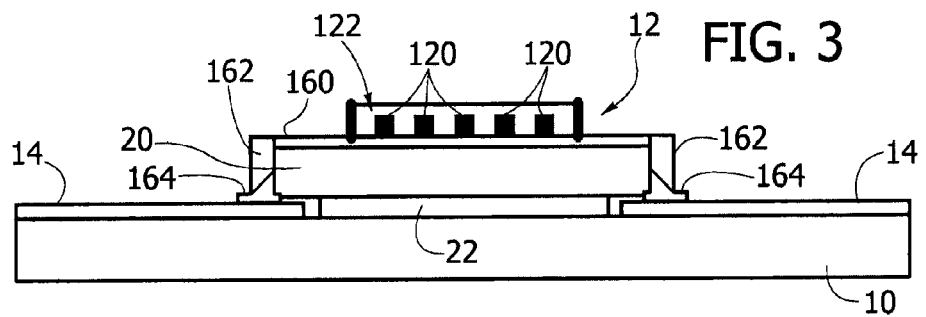
FIG. 3
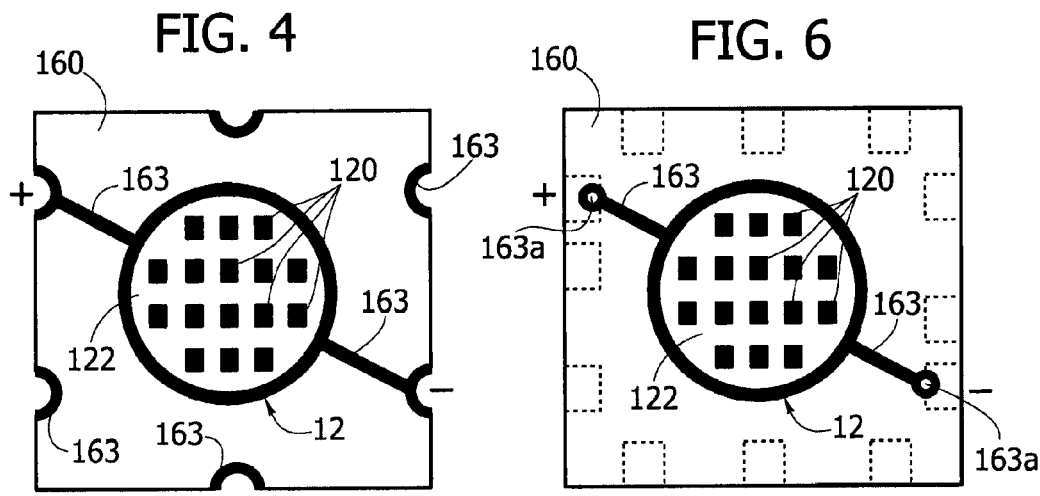
FIG. 4
FIG. 6
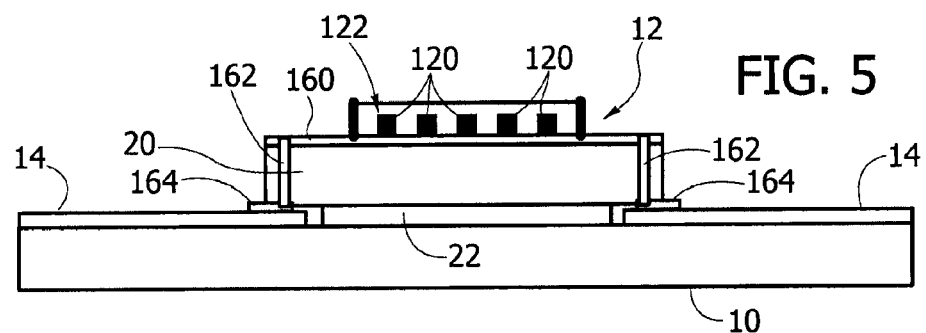
FIG. 5
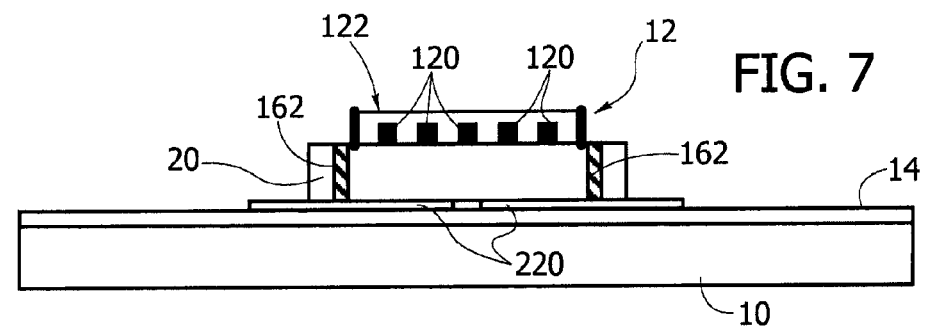
FIG. 7

MOUNTING STRUCTURE FOR SOLID STATE LIGHT SOURCES

RELATED APPLICATIONS

This application claims the priority of Italian application no. TO2011A0000253 filed Mar. 24, 2011, the entire content of which is hereby incorporated by reference.

FIELD OF THE INVENTION

The description relates to solid-state light sources.

In various embodiments, the description may refer to light sources based on the use of light-emitting diodes (LEDs).

BACKGROUND OF THE INVENTION

In the manufacture of solid-state light sources (a sector of activity which is currently known as Solid-State Lighting or SSL) the technology known as "Chip on Board" or CoB is being increasingly used. This technology envisages integrating the LED dies directly on a board acting as a submount or support, avoiding the use of traditional packages. It is thus possible to achieve improved solutions, for example, in terms of i) better thermal properties, ii) better optical coupling and iii) greater degree of integration. In this connection, it is constantly sought to achieve integration of high-level (smart) functions in the so-called light source engine so as to be able to combine an optimum level of efficiency with the capacity to control and manage the emission of light radiation.

The integration, in a single compact structure, of a solid-state light source (e.g. of the LED type) and the associated control stage is a goal which can be pursued in connection with standard SSL applications implemented using current solutions.

The next step in this direction consists in integration with CoB technology, which is able to achieve an improvement in terms of efficiency and compactness of the solution.

OBJECT AND SUMMARY

The inventors have noted that CoB technology, as used in the latest generation SSL applications, does not solve the problem of integrating the light source and the control/drive stage. This means that the corresponding solutions are incompatible with the need to provide compact structures which can be used in general lighting technology applications. The attempt to combine the two different technologies, i.e. LED die integration technology and electronic control and/or drive circuitry technology, therefore results in a kind of impasse: with the current designs it is not possible to achieve planar integration of circuit boards which have different functions and the associated package.

One object of the present invention is to overcome the abovementioned problems.

Various embodiments may achieve the object of providing a compact lighting solution with a high degree of efficiency by integrating the CoB technology of LEDs with a sophisticated integrated control system.

With various embodiments it is possible to achieve at least one of the following objects or aims:

- minimization of the thermal flow path from the LED junction to the external environment;
- increase of the light emission area compared to the other electronic components, with a greater optical efficiency resulting in a greater emission of light radiation without interfering with the adjacent components;
- minimization of the effects of thermal decoupling of materials with different thermal expansion coefficients, ensuring a high degree of reliability of the materials of the structure and the LED dies;
- high degree of versatility in the possible arrangement of the LEDs (e.g. in terms of color, luminosity, form and dimensions of the light emission area) and also with regard to the integrated control features (thermal and optical feedback, passive thermal protection, color regulating capacity, etc.);
- advantages in terms of cost, with the possibility of using standard machining processes (thermally conductive adhesive connection, use of surface-mount technology (SMT), possibility of connection by means of wire bonding) and/or standard materials which are currently used in the electronics sector;
- good insulation in terms of electrical noise (since the power supply line may be isolated from the signal conveying tracks); and
- thermal insulation of the electronic components on the drive board from the light radiation emission area which may reach high temperatures during operation.

BRIEF DESCRIPTION OF THE DRAWINGS

The invention will now be described, purely by way of a non-limiting example, with reference to the accompanying drawings in which:

FIG. 1 is a cross-sectional view of an embodiment;
FIG. 2 is a perspective view of an embodiment;
FIG. 3 is a cross-sectional view of an embodiment;
FIG. 4 is a plan view of a component of an embodiment;
FIG. 5 is a cross-sectional view of an embodiment;
FIG. 6 is a plan view of a component of an embodiment; and
FIG. 7 is a cross-sectional view of an embodiment.

DETAILED DESCRIPTION OF THE DRAWINGS

In the following description various specific details aimed at providing a fuller understanding of the embodiments are described. The embodiments may be implemented without one or more of the specific details, or using other methods, components, materials, etc. In other cases, known structures, materials or operations are not shown or described in detail so that the various aspects of the embodiments may be understood more clearly.

The reference to "an embodiment" in the context of this description indicates that a particular configuration, structure or characteristic feature described in relation to the embodiment is included in at least one embodiment. Therefore, phrases such as "in an embodiment", which may occur at various points in this description, do not necessarily refer to the same embodiment. Moreover, particular forms, structures or characteristic features may be combined in any suitable manner in one or more embodiments.

The reference numbers used here are provided solely for the sake of convenience and therefore do not define the scope of protection or the range of application of the embodiments.

Furthermore, parts and components which are the same or equivalent to each other are indicated in the various figures always by means of the same reference numbers. In order to avoid needlessly complicating the present description of embodiments, once the description of a component part in relation to one of the figures has been provided, the corresponding description will therefore not be repeated for the other figures.

Various embodiments described here may refer to the need to provide the mechanical/electrical/thermal connection of a solid-state light source (below constant reference will be made by way of example to an LED light source) to the associated drive unit, using two boards, i.e. one for the light source and the other one for the associated drive circuit.

Various embodiments may comprise the following parts:
- a base board 10 which may be, for example, of the type with a metal core or nucleus, commonly called Metal Core Printed Circuit Board or MCPCB,
- a light source 12, for example based on the use of CoB technology and therefore with LED dies 120 together with any associated protective and/or phosphorus coating 122,
- a circuit board 14 consisting, for example, of a printed circuit board which is applied onto the base board 10 so as to surround the light source 12 (namely so as to extend peripherally with respect to the source 12) and carrying thereon electronic circuitry components 142 (clearly shown only in FIG. 2) which are able to perform the functions (including smart functions) for driving the light source 12 with associated connectors 144 for signal transfer; and
- a set of mechanical, thermal and electrical interfaces which are able to be provided in a manner described more fully below with reference to various examples of embodiment.

In various embodiments, the board 14 may be aluminum-based.

In various embodiments, the fact that the base board 10 is of the metal core type ensures a low thermal resistance, thereby facilitating cooling.

In various embodiments, as shown for example in FIG. 1, the LEDs 120 are mounted on a substrate (submount) 20 which consists for example of a board of ceramic material, based for example on aluminum oxide or aluminum nitride, and to which the dies 120 of the LEDs are directly connected.

In various embodiments, by using a ceramic submount 20 it is possible to obtain a high thermal conductivity and minimize the path of the heat flow externally, also minimizing the mismatch between the thermal expansion coefficients of the LEDs 120 and the submount 20 so as to ensure a longer working life of the LEDs.

Various embodiments may envisage the presence of the coating 122 for phosphorus conversion and/or protection of the LEDs 120.

In various embodiments, the function of thermal and mechanical interface between the light source 12 (submount 20) and the support board 10 may be performed by means of a thermally conductive adhesive 22.

In various embodiments, the electrical interface function may be achieved by means of wires or connectors 16, for example of the mini SMD type.

For the electrical connection between the LEDs 120 and the control board 14 (namely the circuit components 142) various modes of implementation may be adopted.

In various embodiments, a wire connection technique 16 (for example wire bonding technology) with any subsequent application of insulating coating layers may be used.

In various embodiments it is possible to use connectors of the mini SMD type both on the submount 20 and on the control board 14, with optional insulated-wire connection.

It will be understood that the materials used are commonly available materials, the properties and degree of reliability of which are well-known. From a production point of view, the methods which can be used in order to provide starting materials and the assembly process are also standard in nature. This may result in a reduction in the production costs, in particular owing to the greater possibility for automation and the lower costs in terms of validation of the process.

FIGS. 3 and 4 show embodiments in which the electrical and mechanical connection of the submount 20 on which the LEDs 120 are situated is ensured by providing on the top side of the submount 20 a board 160, for example made of ceramic material, provided with metalized zones 163 (for example formed by means of plating) intended to form electrical connections with the column elements 162 able to perform also the function of supporting the submount 20.

In the case of the layer 22 it is thus possible to use a thermally conductive grease or lubricant which, since it has a paste-like/creamy consistency, ensures that the thickness of the layer 22 is in fact determined by the thickness of the board 14.

FIGS. 5 and 6 refer to embodiments in which the elements 162 assume the form of posts which extend from the board 14 through via holes provided in the submount 20 until they form an electrical connection with end pads 163a provided in metalized zones 163 of the board 160.

The reference number 164 indicates SMD solder joints which are provided at the base of the elements 162 so as to ensure both the electrical connection and the mechanical connection of the submount 20 to the base board 10 via the board 14.

Also in the embodiments to which FIGS. 5 and 6 refer the layer 22 may be formed, instead of with a conductive adhesive material, with a lubricant or grease, namely with a material, the layer thickness of which is essentially determined by the thickness of the board 14.

As schematically shown in the plan view of FIG. 6, it is also possible to provide in the board 160 via holes where there is no electrical connection, but which perform solely mechanical connection functions.

FIG. 7 refers to embodiments in which a double-sided metal core PCB is used in order to form the submount 20 carrying the LEDs 120.

In this case, instead of having—as in the embodiments shown in the preceding figures—a central hole or aperture opposite the light source 12, the board or layer 14 extends continuously above the board 10 and directly supports the submount 20 by means of a solder paste connection 220.

In various embodiments, the submount 20 may have a top layer for arrangement of the LEDs 120 and a bottom layer for providing the electrical contact by means of the solder masses 220. The two metal layers in question are connected together by means of conductive vias 162.

In this case, the mechanical, electrical and thermal interface between the submount 20 and the base board 10 is achieved by the solder paste 220 (with the board 14 arranged in between).

In this embodiment, the assembly process may be a conventional SMD process, with high reliability characteristics and high production volumes. The technology used for the various materials of the components is also well-known.

In various embodiments (structurally related to the illustration in FIG. 7) the submount 20 is a double-sided structure of the ceramic type. In this case, by using ceramic material, it is possible to reduce the thickness of the submount 20, thus reducing the use of material and achieving a higher thermal conductivity and a smaller lighting area.

It will be understood that, in the embodiments such as those shown in FIGS. 3 and 5, the "useful" area for the purposes of assembly of the LEDs 120 on the top surface of the support 20 is greater than the dimensions of the aperture provided in the layer or board 14.

The constructional details illustrated here with reference to a specific embodiment may be freely transposed—where this is technically feasible—to other embodiments, whereby it should be mentioned again that parts or components which are identical or equivalent to each other have been indicated in the various accompanying figures by the same reference numbers, without repeating the corresponding description with reference to each of the figures in which these parts or components are shown.

Obviously, without affecting the principle of the invention, the embodiments and the constructional details may vary, also significantly, with respect to that described and illustrated here purely by way of a non-limiting example, without thereby departing from the scope of the invention as defined in the accompanying claims.

What is claimed:

1. A mounting structure for solid-state light sources, comprising:
    a support board;
    a submount mounted on said support board and having at least one solid-state light radiation source mounted thereon;
    a drive board carrying drive circuitry for said at least one solid-state light radiation source, said drive board being mounted on said support board and extending peripherally with respect to said submount, said drive board being positioned entirely at a level below a level of said submount;
    electrical interface connections between the submount and the drive board for connecting said at least one light radiation source to said drive circuitry; and
    mechanical and thermal interface connections between said submount and said support board.

2. The structure as claimed in claim 1, wherein said at least one light radiation source is an LED.

3. The structure as claimed in claim 1, wherein said mechanical and thermal interface connections comprise a thermally conductive adhesive or solder mass arranged between said submount and said support board.

4. The structure as claimed in claim 1, wherein said drive board has an aperture and wherein said submount is arranged opposite said aperture facing said support board with a thermally conductive mass interposed between said support board said submount.

5. The structure as claimed in claim 4, wherein said thermally conductive mass is selected from a thermally conductive adhesive and a thermally conductive grease.

6. The structure as claimed in claim 1, wherein said electrical interface connections are in the form of wires or connectors.

7. The structure as claimed in claim 1, wherein said electrical interface connections extend through via holes provided in said submount.

8. The structure as claimed in claim 1, wherein said electrical interface connections comprise columnar formations which mechanically support said submount over said support board.

9. The structure as claimed in claim 8, wherein said columnar formations rest on said drive board, at least a part of the columnar formation being electrically connected to said drive board.

10. The structure as claimed in claim 1, wherein said submount comprises a ceramic material.

11. The structure as claimed in claim 1, wherein said submount is a double-sided metal core or ceramic core board having conductive vias extending therethrough to provide at least part of said electrical interface connections.

12. The structure as claimed in claim 1, wherein said at least one light radiation source is an LED directly applied onto said submount.

13. The structure as claimed in claim 1, wherein said mechanical and thermal interface connections comprise a thermally conductive adhesive or solder mass arranged between said submount and said support board, with the arrangement of said drive board in between.

14. The structure as claimed in claim 1, wherein said electrical interface connections are in the form of Surface Mount Device (SMD) connectors.

* * * * *